United States Patent [19]

Nishizawa et al.

[11] Patent Number: 4,526,632

[45] Date of Patent: Jul. 2, 1985

[54] METHOD OF FABRICATING A SEMICONDUCTOR PN JUNCTION

[75] Inventors: Jun-ichi Nishizawa, Sendai; Kazuomi Ito, Ashikaga; Yasuo Okuno, Sendai, all of Japan

[73] Assignee: Jun-Ichi Nishizawa, Sendai, Japan

[21] Appl. No.: 465,176

[22] Filed: Feb. 9, 1983

Related U.S. Application Data

[63] Continuation-in-part of Ser. No. 270,817, Jun. 5, 1981, abandoned.

[30] Foreign Application Priority Data

Jun. 16, 1980 [JP] Japan .................................. 55-81213

[51] Int. Cl.³ .................. H01L 21/208; H01L 21/223
[52] U.S. Cl. ...................................... 148/171; 148/172; 148/188; 148/189; 252/62.3 ZT; 29/569 L
[58] Field of Search ............... 148/1.5, 171, 172, 177, 148/188, 189; 29/569 L; 252/62.3 ZT; 156/616 R, DIG. 77

[56] References Cited

U.S. PATENT DOCUMENTS

| 3,070,467 | 12/1962 | Fuller et al. ........................ 148/1.5 |
| 3,496,429 | 2/1970 | Robinson ......................... 148/175 X |
| 3,549,434 | 12/1970 | Aven .................................. 148/1.5 X |
| 3,551,117 | 12/1970 | Yamanaka et al. ..... 252/62.3 ZT X |
| 3,615,877 | 10/1971 | Yamashita ............................ 148/1.5 |
| 3,670,220 | 6/1972 | Kun et al. ............................. 148/1.5 X |
| 3,745,073 | 7/1973 | Kun et al. ................... 252/62.3 ZT X |
| 3,940,847 | 3/1976 | Park et al. .......................... 148/1.5 X |
| 4,190,486 | 2/1980 | Kyle ................................... 148/171 X |
| 4,389,256 | 6/1983 | Nishizawa et al. ............. 148/177 X |
| 4,465,527 | 8/1984 | Nishizawa .......................... 148/172 |

FOREIGN PATENT DOCUMENTS

| 1946930 | 3/1970 | Fed. Rep. of Germany . |
| 2046036 | 4/1971 | Fed. Rep. of Germany . |
| 952361 | 3/1964 | United Kingdom . |

OTHER PUBLICATIONS

Washiyama et al., "Growth of ZnS, ZnSe from Solution Containing Te and Their Light-Emitting Characteristics", Electronic Materials EFM-78-12, Inst. of Electrical Engineers of Japan, Tokyo, Jpn., Nov. 29, 1978, pp. 1-9.
Journal of Crystal Growth, 39, 1977, pp. 73 to 91.
II–VI Semiconducting Compounds, 1967; pp. 394–399.
J. Electrochem. Soc., pp. 41C–43C, Righthand col. (Feb. 1970).
Jpn. Journal of Applied Physics, vol. 10, No. 4, Apr. 1971, Tokyo (JP), S. Fujita et al.: "Epitaxial Solution Growth of ZnTe on ZnSe", pp. 516–517.

Primary Examiner—George T. Ozaki
Attorney, Agent, or Firm—Cushman, Darby & Cushman

[57] ABSTRACT

A method of forming a pn junction with a Group IIB-VIB compound semiconductor containing Zn is disclosed, the method including preparing an n type semiconductor region either locally or entirely in a Group IIB-VIB compound semiconductor crystal obtained by relying on a crystal growth method in liquid phase using a temperature difference technique, and subjecting this crystal to a thermal annealing in a Zn solution or in a Zn atmosphere to produce an n type region. Crystal growth is conducted while controlling the vapor pressure of the constituent Group IVB element to produce a p type region. A combination of all these steps gives a more stable pn junction.

8 Claims, 1 Drawing Figure

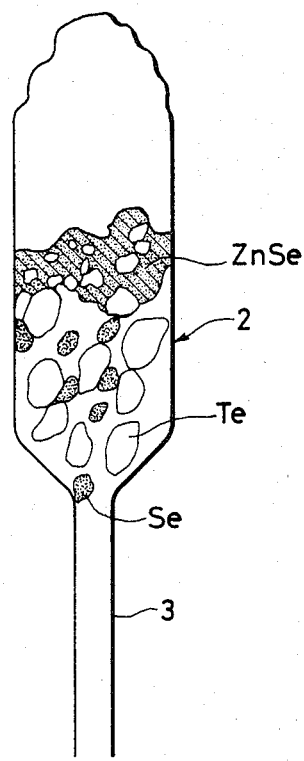

METHOD OF FABRICATING A SEMICONDUCTOR PN JUNCTION

CROSS-REFERENCE TO RELATED APPLICATIONS

This application is a continuation-in-part of our earlier application Ser. No. 270,817 filed June 5, 1981, and abandoned.

BACKGROUND OF THE INVENTION (a) Field of the Invention

The present invention relates to the fabrication of a semiconductor pn junction, and more particularly, it pertains to a method of fabricating a pn semiconductor junction by the use of Group IIB-VIB compound semiconductors.

(b) Description of the Prior Art

Group IIB-VIB compound semiconductors, such as ZnS and ZnSe, are semiconductors having a relatively large energy band gap. Thus, if it is possible to form a good pn junction by the use of a semiconductor material selected from Group IIB-VIB compound semiconductors, the resulting devices will have novel functions and especially light-emitting diodes (hereinafter referred to as LED or LEDs) which can emit light in a wavelength region whose peak intensity of light emission is shorter than about 5500Å. In terms of color such a light emission ranges from blue-green to blue-violet.

However, as is well known with many of the Group IIB-VIB compound semiconductors, such as ZnS and ZnSe, the resulting crystals have only an n type conductivity. The art has been unable to produce stable p type semiconductor crystals except ZnTe.

The conductivity types and the energy band gaps of typical currently available Group IIB-VIB compound semiconductors are shown in the Table below.

TABLE

| Semiconductor material | ZnS | ZnSe | ZnTe | CdS | CdSe | CdTe |
| --- | --- | --- | --- | --- | --- | --- |
| Conductivity type | n | n | p | n | n | n / p |
| Energy band gap(eV) | 3.6 | 2.8 | 2.2 | 2.5 | 1.74 | 1.5 |

First an n type semiconductor crystal will be described. N-type crystals, including those having a low resistivity, are relatively easy to obtain in the IIB-VIB compounds with a narrower band gap. They can be obtained by doping a Group III or Group VII element which can serve as an n type impurity. However, in the past it has been impossible to obtain a stable p type semiconductor crystal by doping an impurity by relying on the same impurity-doping technique as above described. More precisely, even when: (1) an impurity serving as an acceptor is doped in order to obtain a p type crystal, or more concretely even when an impurity is doped from liquid phase during the solution growth to form a p type semiconductor, (2) when an acceptor impurity is doped into an n type semiconductor crystal by relying on the diffusion technique to thereby convert the conductivity type of a portion of such n type crystal into a p type, (3) it is intended to convert the conductivity type of a portion of a semiconductor crystal into a p type by relying on the alloy method, the resulting crystal either still remains the original n type, or it becomes a crystal having a high resistivity to approximate that of an insulator. Thus, practically useful p type semiconductors have not been obtained, hence it has not been possible to fabricate a good pn junction.

The problem of crystallinity of the crystal obtained is considered to be the main reason for this. Therefore, the following description will refer to the growth of a Group IIB-VIB compound crystal by selecting a ZnSe crystal as an example.

Conventional procedures for manufacturing substrate crystals such as ZnSe have required a high temperature of about 1500° C., for example, in Bridgman's method. The vapor transport method also requires a high temperature of 1000° C., or even higher. Thus, these conventional methods give rise to the development of a very large deviation from stoichiometry. The more the Group VI element atoms such as Se escape from the crystal, the more the crystal will tend to become an n-type crystal. If there is a large deviation from stoichiometry, the vacancies will easily combine with the residual impurities located within the crystal, or with the impurities which are later introduced into the crystal during a subsequent process. Thus, the number of vacancies is hard to control, and the presence of such vacancies further complicates the later formation of a pn junction. Thus, it is quite desirable to form a substrate crystal at as low a temperature as possible.

The reason the art has not been able to obtain a good p type semiconductor crystal with a Group IIB-VIB compound semiconductor is because of the fact that, when an acceptor impurity is introduced in order to obtain a p type semiconductor crystal, there develop, within the crystal, defects which function as donors in accordance with the amount of the acceptor impurity which is introduced in the crystal as a natural trend to thermo-dynamically establish stability. This develops acceptor carrier compensation.

Development of acceptor carrier compensation as described is called a "self-compensation phenomenon". Those defects developing within the crystal which function as the donor consist of, for example, Se vacancies which develop due to the escape of Se atoms from the crystal ZnSe, this escape taking place because, in such compound semiconductors as ZnSe, Se atoms have a vapor pressure higher than Zn atoms, and because, for this reason, Se atoms easily escape from the ZnSe crystal. These defects also include a complex of Se vacancies with the doped impurity. These defects, i.e. Se vacancies and/or complexes with Se vacancies and impurities, function as donors.

This effect holds true not only for ZnSe, but also for ZnS as well. The above description has been made only on those Group IIB-VIB compounds as will provide n-type crystals. Other compounds, such as ZnTe which provide only a p type crystal, and CdTe which provides crystals of both n-type and p-type conductivities, are not included in the present invention.

In particular, ZnSe and ZnS, which are Group IIB-VIB compounds containing Zn among their component elements, have wide forbidden band gap, and therefore they are important materials for a blue-LED which cannot be made using Group III-V compounds. Thus, the appearance of a p-n junction having good characteristics is keenly desired.

BRIEF DESCRIPTION OF THE DRAWING

The attached FIGURE is a sketch of an ampule containing Te, Se and ZnSe materials.

In this sketch a quartz ampule 2 contains a source crystal of ZnSe floating on the surface of a Te solvent. Se is added at a rate of 1 to 30 atom percent into the Te solvent. As the ratio of Se to Te increases the vapor pressure of Se becomes higher and the compensation of crystals to be precipitated can be stoichiometrically controlled by controlling the Se/Te ratio. A thin quartz pipe 3 as a heat sink is connected to the lower end of the ampule to control the thermal flow of the system so that the temperature of the region at which crystallization commences is at the lowest temperature. The tip of the ampule is conical, at an angle preferably about 30° to 80°, most preferably about 60°, to facilitate formation of a single crystal.

SUMMARY OF THE INVENTION

It is, therefore, a primary object of the present invention to provide a method of fabricating, with a relative ease, a practically useful semiconductor pn junction, either by solving the problems encountered in the conventional manufacture of a pn junction in Group IIB-VIB compound semiconductors containing Zn, or by positively using such problems to advantage.

Another object of the present invention is to provide a method as described above, which is intended to first obtain an n type low resistivity semiconductor region either regionally or entirely in a Group IIB-VIB compound semiconductor obtained by relying on a crystal growth method in the liquid phase using the temperature difference technique, and by subjecting the resulting semiconductor crystal to heat treatment in a Zn solution or in a Zn atmosphere. If an n type semiconductor region is obtained as described above in a p type Group IIB-VIB compound semiconductor, a stable pn junction is formed. Alternatively, if an n type semiconductor crystal is obtained in an n type Group IIB-VIB compound semiconductor, the resulting n type region is useful to form a pn junction in subsequent processing.

Still another object of the present invention is to provide a process of making a low resistivity n type semiconductor crystal, as described above, but by controlling the vapor pressure of the Group VI element which is a constituent element of the Group IIB-VIB compound semiconductor employed.

Yet another object of the present invention is to provide a process of forming an n type semiconductor crystal which contains Zn, grown using the solution growth method and the temperature difference technique, by subjecting a Group IIB-VIB compound semiconductor to heat treatment in a Zn atmosphere or in a Zn solution.

A further object of the present invention is to provide a process described of the type just above which is carried out by controlling the vapor pressure of the constituent Group VIB element thereby providing a pn junction having a still higher quality.

DETAILED DESCRIPTION OF THE PREFERRED EMBODIMENT

The present invention will now be described in further detail. As stated above, in Group IIB-VIB compound semiconductors, such as ZnS, ZnSe and CdS, Group VIB elements in general have a vapor pressure higher than that of the Group IIB elements. Thus, at the time the substrate crystal is grown, or in other processes including heat treatment, the Group VIB element readily escapes from the grown crystal, causing a deviation from stoichiometry in the grown crystal. The resulting defects, such as vacancies which represent lattice sites from which the Group VIB element has escaped, serve as donors and the resulting crystal always tends to become an n type. Deviation from stoichiometry in the compound semiconductor crystal will occur more intensively as the temperature of the heat treatment step becomes higher. For these reasons the growth method in which the substrate crystal, which is used as the starting crystal to make the finished device, is extremely important.

For all of these reasons the substrate crystal, which is used for the fabrication of devices having a pn junction from Group IIB-VIB compound semiconductors, must be prepared by the solution growth method using the temperature difference technique. For this part of art, reference is to be made to U.S. Pat. No. 4,465,527 granted Aug. 14, 1984 in the name of Jun-Ichi Nishizawa, (the disclosure of which is incorporated by reference) one of the present inventors of the subject application.

The present invention is further described in the FIGURE which illustrates what is depicted in FIG. 3 of U.S. Pat. No. 4,465,527, identified above, and the object of the present invention is that, in a solution growth of a ZnSe crystal, Te is used as the main constituent of a solvent, and, in the growth operation, a predetermined amount of Se, a constituent element having a higher vapor pressure among the constituent elements of the crystal to be grown, is added to thereby control the vapor pressure of the Group VIB element during crystal growth. Furthermore, as in the crystal growth method, ZnSe, which is the source crystal, is disposed on the surface of the solvent and the temperature at this region is set to be 10°–50° C. higher than the temperature at the crystal deposition region, whereby the source crystal is transported to the crystal deposition region due to thermal diffusion and diffusion due to the difference in concentration of solute in the solvent, and thus the crystal growth is never restricted as to its speed by the solubility, at saturation, of the solute contained in the solvent, making it possible to perform a growth at a low temperature, so that the dissolution of Te in the crystal is minimized. In addition, because the vapor pressure of Se is carefully controlled, it is possible to obtain a ZnSe having a reduced deviation from stoichiometric composition.

According to the method outlined above, a sufficiently good crystal can be obtained from such compound semiconductor material, such as ZnSe, to serve as a semiconductor substrate having a greatly reduced deviation from stoichiometry, at a low manufacturing temperature in the range of about 950°–1000° C., or possibly lower.

It should be understood here that the solution growth method referred to above is applicable to the growth of not only ZnSe crystals, but also to the growth of crystals such as CdS, CdSe and ZnS which usually provide only n type crystals, as shown in the following Table. This crystal growth method is also applicable to the growth of ZnSe crystals containing 1% or less of Te, and also to the growth of other mixed crystals.

The present invention will be described below in more detail with respect to the instance in which ZnSe as a Group IIB-VIB compound semiconductor is employed as a starting semiconductor material.

First, by relying on the low-temperature solution growth method a ZnSe crystal having an extremely reduced deviation from stoichiometry is obtained using the temperature difference technique.

In order to render the whole region or a part of the region of this ZnSe crystal an n type region, it is not that an n type impurity is doped in the crystal in advance, but rather the procedure is such that a crystal not doped with a donor impurity in a manner as described above is not formed first. Subsequently this crystal is subjected to heat treatment at a temperature sufficiently lower than the temperature used in the crystal growth and in a Zn atmosphere or in a Zn solution, to intentionally develop the requisite deviation from stoichiometry so as to cause a shortage of Se atoms in the crystal rendering the crystal an n type.

According to this method, no donor impurity is introduced, so that the resistivity of the n type crystal is determined by the number of Se vacancies developed. Accordingly, the resisitivity can be controlled by both the duration and the temperature of the heat treatment carried out in the Zn atmosphere.

For example, a ZnSe crystal is converted, in said Zn atmosphere, to an n type crystal having a carrier density of the order of $10^{17}$ cm$^{-3}$ or lower. In this part of the process, the entire region of the crystal is converted to the n type, and this crystal is used as a semiconductor substrate. Thereafter, an acceptor impurity is diffused into the substrate to convert the conductivity type of a portion of the n type crystal into a p type and thereby form a pn junction. Alternatively, a p type semiconductor layer doped with an acceptor impurity is grown on this substrate using the liquid phase epitaxial growth technique also forming a pn junction. The method of producing only a p type semiconductor region will be described later.

According to the present invention, an n type semiconductor region is obtained without doping a donor impurity, and as such in forming the pn junction as described above the following advantages and superiorities are achieved.

A donor impurity in an amount of the order of $10^{17}$ cm$^{-3}$ represents only a very small amount, and therefore, there are many difficulties in introducing and carefully controlling such an extremely small amount of donor impurity. According to the present invention, however, an impurity is not doped, but rather carrier concentration control can be achieved easily because this part of the process uses only heat treatment. Also, in the known method of controlling the carrier concentration of the n type by doping an impurity, many technical difficulties are encountered in carrying out the impurity doping, but also care must be taken so that the number of Se vacancies is always sufficiently smaller than the carrier concentration due to this impurity used. In the crystal growth method according to the prior art, it is difficult to keep the amount of Se vacancies at a level below a predetermined value, as stated above. In complete contrast, according to the method of the present invention, there is no need to take the amount of the impurity or its presence into consideration. Furthermore, according to the method of the present invention, there is the further advantage that virtually no complications caused by the contribution by the complex of the vacancies and the impurity develop.

The present invention is particularly well suited for use in the formation of a p type semiconductor region accomplished in a subsequent step of the process. Thus if one wishes to use the technique of diffusing an acceptor impurity to form a p type crystal, it should be understood that, in case the semiconductor crystal having an n conductivity type is given by a donor impurity, the acceptor impurity must be doped in a quantity sufficient to compensate for the donor impurity and that the net of carriers will be hole carriers. If the amount of donor impurity is large, the compensation for the donor impurity will not be carried out efficiently as desired, and the formation of a p type region, which has been accepted in the art as being difficult to form, will become all the more difficult. In the present invention, however, since no donor impurity is doped these concerns are avoided, and thus the subsequent formation of a p type region can be accomplished with relative ease.

It is not desirable to achieve an unnecessarily large degree of deviation from stoichiometry caused by heat treating the crystal in a Zn atmosphere, the degree of deviation from stoichiometry is as small as possible while still allowing for fabrication of the intended device. We have experimentally checked the effect of deviation from stoichiometry, and the optimum conditions for using the resulting device as a light-emitting diode are as described below.

In the present invention, when annealing is conducted for about 1 hour in a Zn melt solution at 900°–1000° C., an n type region is obtained having a resistivity of 0.1–1.0 Ω-cm up to a depth of about 10 μm. In case the annealing temperature is 800°–900° C. and is conducted for about 1 hour, the resistivity will become 10–20 Ω-cm and the depth will be about 7 μm. At an annealing temperature of 600° C., the resistivity will be 100–200 μcm and the depth will be about 3 μm. The skilled operator will select the annealing temperature and annealing duration in accordance with requirements of the device or product to be fabricated.

The method of manufacturing a p type semiconductor crystal, which is used as the starting substrate crystal for the fabrication of a desired device will now be described.

The amount of deviation from stoichiometry can be reduced by the lower temperature growth because the dissociation pressure of the group VIB element from the IIB-VIB compound decreases with a decrease in the temperature. It is possible to grow a crystal at a much lower temperature by the temperature difference method because the growth is not limited by the saturation-solubility. In addition, at the time a crystal is grown, not only is an acceptor impurity doped, but also concurrently, the method of preventing Se vaporization out of the crystal during its growth is used, in the manner described above. This is done by carrying out the growth in an atmosphere of Se vapor which is a constituting Group VI element having a high vapor pressure while controlling this vapor pressure during the growth of the crystal.

Use of the so-called vapor pressure control to the solution growth method has been proposed by one of the present inventors. By following this combined method, it is possible to suppress the amount of deviation from stoichiometry to an even further lower level. Not only that, but also this will suppress to a desirable degree the self-compensation effect which has been referred to above as urging the generation of Se vacancies which serve as a donor and which compensate for the carriers which serve as an acceptor impurity to render the crystal thermodynamically stable. Thus, it is possible to reproducibly and repetitively obtain a p type ZnSe crystal by doping an acceptor impurity.

Various kinds of acceptor impurities can be used for rendering the conductivity type of the crystal into a p type, however we prefer Au or Ag. These metals have a large diffusion coefficient, and have a large diffusion velocity at a low temperature also, and thus have the advantage that a pn junction can be formed at a low temperature.

It is easy to render a portion of the p type crystal into an n type crystal and to thereby form a pn junction. To this end, it is only necessary to subject the crystal to thermal annealing in a Zn atmosphere.

The crystal growth method in liquid phase using the temperature difference technique under a controlled vapor pressure of a Group VI element, such as Se referred to above, is capable of suppressing the amount of Se vacancies to a much reduced level as compared with the conventional solution growth method using the temperature difference technique alone without controlling the vapor pressure of the constituent Group VI element. The vapor pressure control method may be incorporated in the above described process of manufacturing the starting crystal to serve as the substrate, through annealing in a Zn atmosphere to convert the starting crystal into an n type.

If the crystal is subjected to thermal annealing in a Zn atmosphere to convert the crystal's conductivity type into n type and if it is intended to use such n type crystal as the substrate, and thereafter to form a p type region, the Se vapor pressure control technique as described above is employed. More specifically, even in the process the n type crystal using the diffusion method to render a portion of the crystal into a p type to form a pn junction, an arrangement to surround the n type crystal with Se vapor, while controlling the pressure of this vapor, is also within the ambit of our invention. In this manner the number of Se vacancies of the ZnSe crystal can be controlled and, concurrently, new development of Se vacancies can be suppressed, making it easy to carry out the diffusion of an acceptor impurity and to form the desired p type region.

This also applies to the growth of a p type region on top of the n type substrate through the crystal growth technique. Since, during the ordinary crystal growth method, Se vacancies and the acceptor impurity mutually enter into the two adjacent regions at the growth interface, the vapor pressure control technique becomes extremely effective.

The features and effects of the present invention are considered to be fully described and explained above, however, two examples of the present invention will be given for a better understanding of the invention.

EXAMPLE 1

Using the abovesaid temperature difference technique under controlled vapor pressure, using Te and Se as the constituents of a solvent, and further adding Au as an impurity to this solvent, and floating a source crystal of ZnSe on the surface of the solvent, crystal growth is conducted in a quartz ampule having the configuration as shown in the FIGURE. The ampule is sealed at a vacuum of $1 \times 10^{-6}$ mmHg or higher. The growth process is continued for about one week at a growth temperature of 950° C. and at a temperature difference of 20° C. As a result, a p-type ZnSe monocrystal of 10 mm in diameter and 15 mm in length is obtained. This crystal, having been exposed to the vapor pressure control of Se, has few Se-vacancies, with its impurity concentration being of the order of $10^{15}/cm^3$.

This crystal is cut parallel along the <111> surface, and a wafer having a diameter of 10 mm and a thickness of 300 μm is formed. After washing and etching the resulting wafer, it is enclosed in vacuum together with Zn, and they were heat-treated at 900° C. for one hour. An n type layer having a resistivity of 0.1–1.0 Ω-cm is obtained up to a depth of about 10 μm from the surface of the p type crystal. The rear side of this substrate crystal is removed by chemical etching to a thickness of about 20 μm to reveal the p type region. On the surface of the crystal, the one on which an n type layer is deposited using either vacuum evaporation or an alloy method, an alloyed metal of In-Sn is applied. This metal serves as an electrode metal. Au is evaporation-deposited in vacuum on the back p type region.

The resulting assembly is charged in a quartz tube, and evacuated to vacuum. Then, a highly pure argon gas is passed into this tube, while keeping the tube at a temperature of 300°–400° C., preferably 330°–350° C., for a predetermined length of time of, for example, 3 minutes. Thereafter, the tube is subjected to slow cooling, and thus a diode having a pn junction is obtained.

EXAMPLE 2

A crystal is first obtained by using Te and Se as the constituents of a solvent, and at a growth temperature of 950° C. and a temperature difference of 20° C. and for a growth time of one week with no addition of an impurity. This crystal is then subjected to a treatment similar to that of Example 1, and thus a wafer is manufactured. This wafer, together with Zn, is enclosed under vacuum, and they are heat-treated at 900° C. to 1000° C. for 24 hours, and an n-type crystal having a low resistivity is formed. This wafer is used as a substrate crystal.

Using Te and Se as the constituents of a solvent, and adding an impurity Au in the solvent, and floating a ZnSe source crystal on the surface of the solvent, growth is conducted at a growth temperature of 650° C. for 2 hours at a temperature difference of 10° C. As a result, a p-type ZnSe epitaxial growth layer of about 20 μm is obtained on the n-type ZnSe substrate crystal. By forming an electrode metal similar to that of Example 1 on both sides of this wafer having a p-n junction, it is possible to manufacture a diode.

What is claimed is:

1. A method of forming a pn junction with a Group IIB-VIB compound semiconductor crystal containing Zn as a crystal-constituent Group IIB element, substantially to the exclusion of Te as a constituent element of said compound semiconductor crystal, said method comprising the steps of:
   (a) using as a solvent a mixture of Te and a crystal-constituent Group VIB element other than Te;
   (b) charging a Group IB element as a p type impurity into said solvent;
   (c) floating a source crystal of sid group IIB-VIB compound semiconductor on the surface of said solvent;
   (d) establishing a temperature difference between said source crystal and a surface of a crystal deposition zone;
   (e) depositing a p type crystal at said crystal deposition zone at a constant temperature;
   (f) making a wafer by slicing the crystal thus obtained; and (g) heat treating the resulting wafer in a Zn atmosphere, thereby forming an n type layer locally in said p type crystal to provide a pn junction in said wafer.

2. The method according to claim 1, in which said Zn atmosphere is a Zn solution.

3. A method according to claim 1, in which said Group IIB-VIB compound semiconductor is ZnSe.

4. A method according to claim 1, in which said crystal is grown at a predetermined value of the amount of the Group VIB element relative to Te in said solvent.

5. A method according to claim 1 in which said p type impurity is selected from the group consisting of Ag and Au.

6. A method of forming a pn junction with a Group IIB-VIB compound semiconductor crystal containing Zn as a crystal-constituent Group IIB element, substantially to the exclusion of Te as a constituent element of said compound semiconductor crystal, said method comprising the steps of:
(a') using as a solvent a mixture of Te and a crystal constituent Group VIB element other than Te;
(b') floating a source crystal of said Group IIB-VIB compound semiconductor on the surface of said solvent;
(c') establishing a temperature difference between said source crystal and a crystal deposition zone;
(d') causing the deposition of a crystal having high resistivity in said deposition zone at constant temperature;
(e') making a wafer by slicing the crystal and subjecting said wafer to a heat treatment in a Zn solution to render the whole wafer to a low resistive n type; and
(f') diffusing, into the resulting wafer, a p type impurity while controlling, at a predetermined value, a vapor pressure of the VIB element which is a constituent element of said Group IIB-VIB semiconductor, thereby forming a pn junction in said n type crystal.

7. A method according to claim 6 in which said p type impurity is selected from the group consisting of Ag and Au.

8. A method of forming a pn junction with a Group IIB-VIB compound semiconductor crystal containing Zn as a crystal-constituent Group IIB element, substantially to the exclusion of Te as a constituent element of said compound semiconductor crystal, comprising the steps of:
(a) using the n type crystal obtained following said step (e') in claim 6 as a substrate crystal;
(b) using Te and Se which is a Group VIB element as a solvent, said Se being charged in a predetermined amount relative to Te;
(c) floating a source crystal of said Group IIB-VIB compound semiconductor on the surface of said solvent;
(d) establishing a temperature difference between said source crystal and said n type substrate crystal;
(e) adding a p type impurity selected from the group consisting of Ag and Au into said solvent; and
(f) forming a p type layer on top of the n type crystal at a constant temperature, thereby forming a pn junction in the crystal.

* * * * *